(12) United States Patent
Phillips et al.

(10) Patent No.: US 10,466,294 B2
(45) Date of Patent: *Nov. 5, 2019

(54) SENSOR TO MONITOR HEALTH OF METAL OXIDE ARRESTERS

(71) Applicant: Electric Power Research Institute, Inc., Charlotte, NC (US)

(72) Inventors: Andrew John Phillips, Harrisburg, NC (US); Christiaan Engelbrecht, Ede (NL); Robert Carlton Lynch, Fuquay-Varnia, NC (US); J. Mark Major, San Antonio, TX (US)

(73) Assignee: ELECTRIC POWER RESEARCH INSTITUTE, INC., Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/238,927

(22) Filed: Jan. 3, 2019

(65) Prior Publication Data

US 2019/0154750 A1   May 23, 2019

Related U.S. Application Data

(63) Continuation of application No. 15/646,519, filed on Jul. 11, 2017, now Pat. No. 10,209,293.

(60) Provisional application No. 62/361,018, filed on Jul. 12, 2016.

(51) Int. Cl.
| | | |
|---|---|---|
| *G01R 31/12* | (2006.01) |
| *G01R 15/18* | (2006.01) |
| *H01C 7/12* | (2006.01) |
| *G01R 31/14* | (2006.01) |

(52) U.S. Cl.
CPC ....... *G01R 31/1236* (2013.01); *G01R 15/181* (2013.01); *G01R 31/14* (2013.01); *H01C 7/12* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,384,289 A | * | 5/1983 | Stillwell | G01K 1/024 324/126 |
| 4,611,207 A | * | 9/1986 | Anderson | G01R 19/155 324/126 |
| 5,621,309 A | | 4/1997 | Feldman | |
| 8,669,769 B2 | | 3/2014 | Tsuge | |
| 2002/0191360 A1 | | 12/2002 | Colombo et al. | |
| 2004/0066598 A1 | | 4/2004 | Gudmundsson et al. | |
| 2006/0084419 A1 | | 4/2006 | Rocamora et al. | |
| 2008/0246507 A1 | * | 10/2008 | Gunn | H02G 7/00 324/764.01 |
| 2012/0239321 A1 | | 9/2012 | Normoyle et al. | |
| 2014/0176336 A1 | | 6/2014 | Li et al. | |

(Continued)

*Primary Examiner* — Daniel R Miller
(74) *Attorney, Agent, or Firm* — Trego, Hines & Ladenheim, PLLC; Brandon Trego; Jonathan Hines

(57) ABSTRACT

A sensor to monitor health of surge arresters such as metal oxide arresters is disclosed. The sensor includes a housing; a sensor assembly contained in the housing, the sensor assembly including an electronics board to receive, transmit, process, and store signals; and a voltage measurement strap extending around a periphery of the housing, the voltage measurement strap being electrically connected to the electronics board and configured to measure voltage using electric field.

13 Claims, 4 Drawing Sheets

(56) References Cited

U.S. PATENT DOCUMENTS

2016/0261106 A1 9/2016 Westerlund
2017/0108550 A1 4/2017 Raschke

* cited by examiner

SENSOR TO MONITOR HEALTH OF METAL OXIDE ARRESTERS

BACKGROUND OF THE INVENTION

This invention relates generally to overvoltage protection of power transmission systems, and more particularly to a sensor for monitoring a health of a surge arrester, such as a metal oxide arrester, installed in a power transmission system.

Overvoltages in power transmission systems occur as a result of lightning incidents, switching actions, and any other action that may cause overvoltages in the power transmission system. These overvoltages can cause damage to power transmission system assets. One of the ways that utilities protect against such overvoltages is by using surge arresters, such as a metal oxide arrester, which are installed in substations and power transmission conductors. These arresters are typically positioned in the vicinity of a power transmission asset and are used to limit the amount of voltage being passed to the power transmission asset by diverging surges to ground.

Metal oxide arresters have become the standard type of surge arrester. Metal oxide arresters consist of metal oxide varistor blocks connected in series which have a non-linear volt-current characteristic. These arresters can age due to (1) diverting multiple surges, (2) water intrusion in the housing, and (3) power frequency overvoltages. The aging of the arresters can result in their ultimate failure which often causes collateral damage to nearby power transmission assets and a safety hazard together with a potential outage.

Accordingly, there remains a need for a sensor that is capable of identifying high risk arresters prior to failure and capable of integrating with Supervisory Control and Data Acquisition (SCADA) systems to allow remote monitoring.

BRIEF SUMMARY OF THE INVENTION

This need is addressed by the present invention, which provides a sensor for monitoring a health of metal oxide arresters and providing data to a utility so that action may be taken prior to failure of the arrester.

According to one aspect of the invention, a surge arrestor sensor configured to monitor a health of a surge arrester includes a housing; a sensor assembly contained in the housing, the sensor assembly including an electronics board to receive, transmit, process, and store signals; and a voltage measurement strap extending around a periphery of the housing, the voltage measurement strap being electrically connected to the electronics board and configured to measure voltage using electric field.

According to another aspect of the invention, a surge arrester sensor includes a housing having a sensor assembly contained therein, the housing including first and second spaced-apart ends interconnected by a sidewall; a voltage measurement strap extending around a periphery of the housing and electrically connected to the sensor assembly; and a central shaft extending through a center of the housing, the central shaft having a first distal end attached to an energized end of a surge arrester and a second distal end connected to an energized conductor.

BRIEF DESCRIPTION OF THE DRAWINGS

The invention may be best understood by reference to the following description taken in conjunction with the accompanying drawing figures, in which.

DETAILED DESCRIPTION OF THE INVENTION

Figure 1:
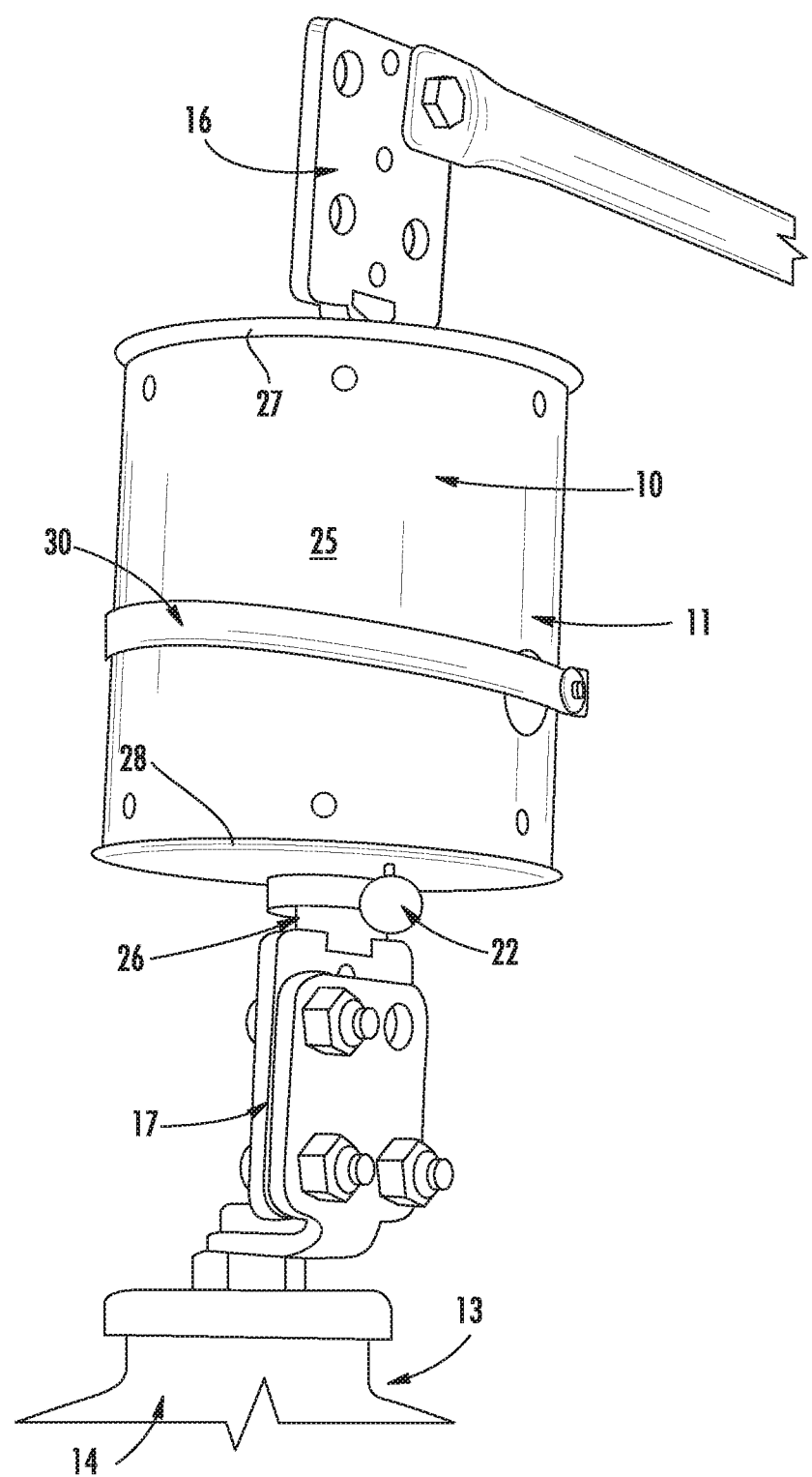
FIG. 1 shows a sensor according to an embodiment of the invention installed with a surge arrester.
Figure 2:
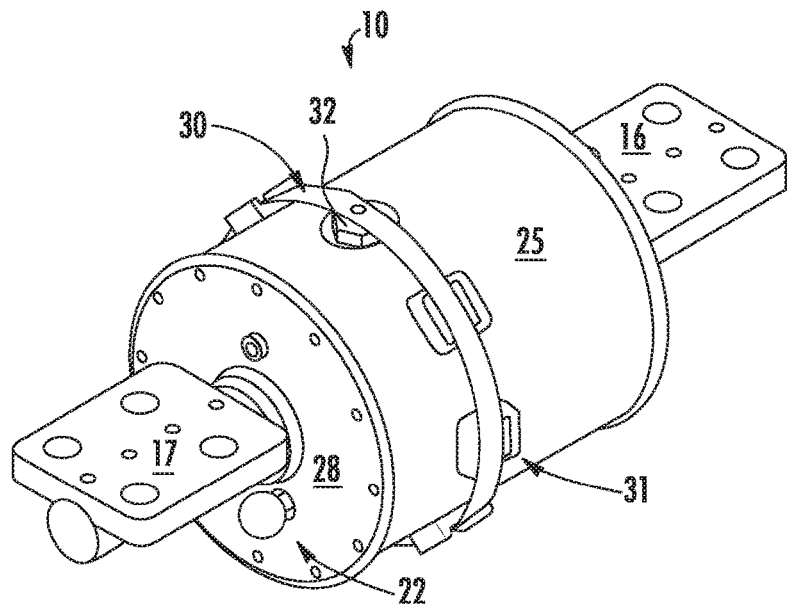
FIG. 2 is a perspective view of the sensor of FIG. 1.
Figure 3:
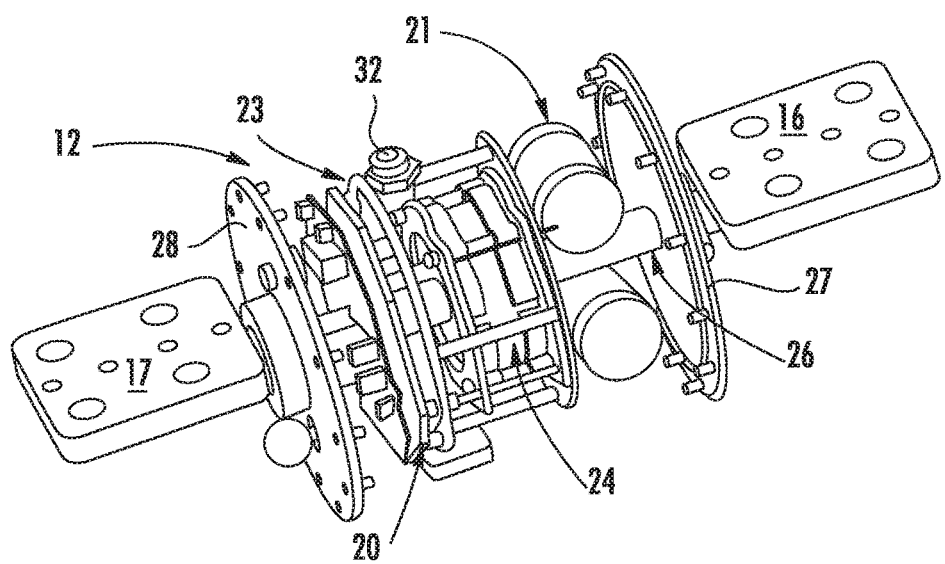
FIG. 3 shows internals of the sensor of FIG. 1.

Referring to the drawings wherein identical reference numerals denote the same elements throughout the various views, FIGS. 1-3 illustrate a sensor 10 configured to monitor and transmit data representative of a health of a surge arrester used in a power transmission system. The sensor 10 includes a housing 11 which encloses a sensor assembly 12 and protects it from electromagnetic influences. The sensor assembly 12 is configured to monitor a health of a surge arrester and to provide data to a utility while the arrester is in-service. It should be appreciated that the housing 11 may be metal, plastic, and/or any other suitable material.

The housing 11 is generally cylindrical and includes a sidewall 25 and two spaced-apart end walls 27 and 28 (end wall 27 is the energized conductor side end wall and end wall 28 is the arrester side end wall). It should also be appreciated that the shape and/or design of the housing 11 may be of any suitable design and/or shape to conform to a particular application—the generally cylindrical shape is used as an example only.

Unlike other arrester sensors which are installed on an arrester's ground lead, the sensor 10 is connected to an energized end 13 of a surge arrester 14, FIG. 1 (between the energized end 13 and an energized conductor). As illustrated, the sensor 10 includes connectors, such as National Electrical Manufacturers Association (NEMA) pads 16 and 17, disposed at opposing ends of the housing 11 to allow installation of the sensor 10 on the energized end 13 without significant modification to the way the arrester 14 is installed. This eliminates several problems associated with ground lead installation. For example, installing arrester sensors on the ground lead requires the arrester to be installed on an insulating base which in turn requires additional engineering and modification. There are also issues with measuring an electric field (E-field) at the grounded side of the arrester.

Typical arrester sensors measure total leakage current (residual=total leakage current minus capacitive current derived from voltage measurement, resistive, and capacitive) through the arrester, some also attempt to extract the resistive component of the leakage current. This is done by measuring E-field at the base of the arrester to try and get a measurement of the applied voltage and then use algorithms to determine the resistive current. The challenge with measuring E-field at the grounded side of the arrester and deriving arrester energization is that the other phases are almost equidistant from the sensor as the phase of the arrester is being monitored. This means that a phase shift exists in the voltage waveform, which needs to be compensated for to determine the resistive current. This is geometry dependent and each installation is different, thereby increasing the error. By installing the sensor 10 on the energized end 13, a voltage waveform applied to the sensor 10 may be determined using an E-field probe of the sensor 10, thereby mitigating the impact of the E-Field from nearby energized phase conductors and increasing measurement accuracy.

The sensor assembly 12 is mounted in the housing 11. The configuration of the sensor assembly 12 may be varied to suit a particular application. In the example shown in FIGS. 2 and 3, the sensor assembly 12 includes an electronics board 20 which functions to receive, process, and store signals, to receive external commands, and to transmit data to an external source. The electronics board 20 includes a microprocessor, radio frequency (RF) chip, and may include, for example, a printed circuit board incorporating analog, digital and/or radio-frequency ("RF") electronic components. The electronics board 20 may also incorporate discrete components and/or additional microprocessors. As shown, the sensor 10 is a sealed unit using a Gortex vent to prevent seal pumping without allowing in moisture. The components of the electronics module 20 may also be embedded in potting compound to protect them from environmental influences.

In addition to the electronics board 20, the sensor assembly includes an electric power source for the electronics board 20, such as the illustrated batteries 21 (for example, high density batteries such as lithium polymers), solar harvesting using solar cells (not shown), and/or electric field harvesting.

One or more RF antennas 22 protrude from the exterior of the housing 11 and are electrically connected to the electronics board 20. The RF antennas 22 are used to transmit signals generated by the electronics board 20 to a remote receiver (not shown), and/or to receive RF signals from a remote receiver (not shown) using the incorporated RF chip and communication system. The communication system allows two-way communication and may be based on the IEEE 805.15.4 architecture and/or any other suitable architecture that allows integrating with Supervisory Control and Data Acquisition (SCADA) systems to allow remote monitoring. The communication system also allows measurement parameters, such as sampling rate, to be modified as well as provide a means for updating firmware on the microprocessors. It should be appreciated that the electronics board 20 may also be hardwired for two-way communications. The electronics board 20 may also include 3D solid state accelerometers, temperature sensors, global positioning devices, and/or any other desired sensors for monitoring.

The sensor assembly 12 includes a Rogowski coil 23 and a current transformer 24 (CT). The Rogowski coil 23 is constructed out of patterns on a printed circuit board and is used to measure surge currents diverted by the arrester 14. Metrics such as (1) number of surges, (2) histogram of the surges bin counted by current range, (3) last few surge magnitudes and times, (4) charge in each surge, and (5) histogram of the surge charges are used. The CT 24 is placed around a central shaft 26 and is constructed of a ferromagnetic core wound with copper wire. As shown, the central shaft 26 extends through a center of the housing 11 and interconnects the NEMA pads 16 and 17. The central shaft 26 is grounded to the housing 11 only at the energized conductor side 27 (i.e. non-arrester side) to reduce the capacitive current measured from the sensor 10 to ground.

A voltage measurement strap 30 extend around the sidewall 25 of the housing 11 and is insulated therefrom by insulating standoffs 31 placed between the strap 30 and the sidewall 25. It should be appreciated that other suitable methods for insulating the strap 30 from the housing 11 may be used. The voltage measurement strap 30 is used as an electrode to measure voltage using E-field. The voltage measurement strap 30 is connected to the electronics board 20 via electrical connector 32. It should be appreciated that any suitable shape and/or configuration of electrode may be used for the voltage measurement strap 30.

Figure 5:
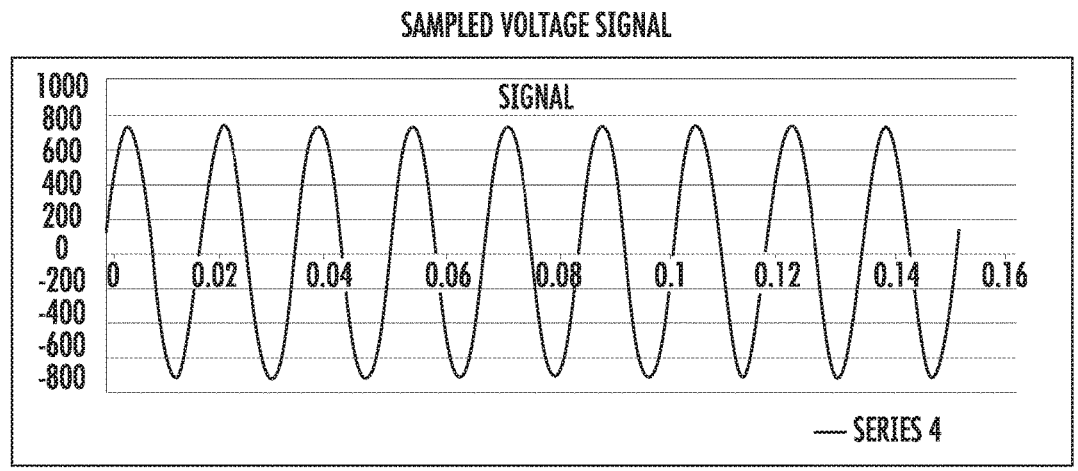
FIG. 5 shows a sample voltage signal used in the analysis of FIG. 4.
Figure 6:
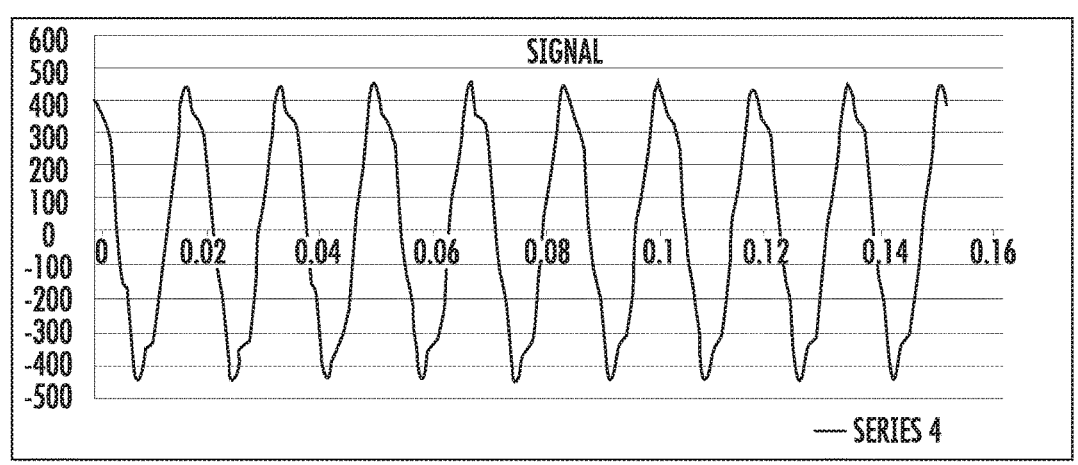
FIG. 6 shows a sample current signal used in the analysis of FIG. 4.

In use, the sensor 10 is attached to the energized end 13 of the surge arrester 14. The sensor 10 then monitors and communicates with a remote station to provide utilities with data representative of the health of the surge arrester 14. The CT 24 measures leakage current and the Rogowski coil 23 measures surge currents diverted by the arrester 14. The voltage measurement strap 30 measures the E-field on the energized end 13 of the arrester 14 (rather than the ground side) and derives the energization voltage waveform. By measuring the E-field on the energized end 13, a more accurate voltage waveform can be derived since it is far less affected by the E-fields from nearby phases. The E-field from the energized end 13 also provides a stronger E-field signal to derive the voltage from. Example current and voltage waveforms can be seen in FIGS. 5 and 6.

Figure 4:
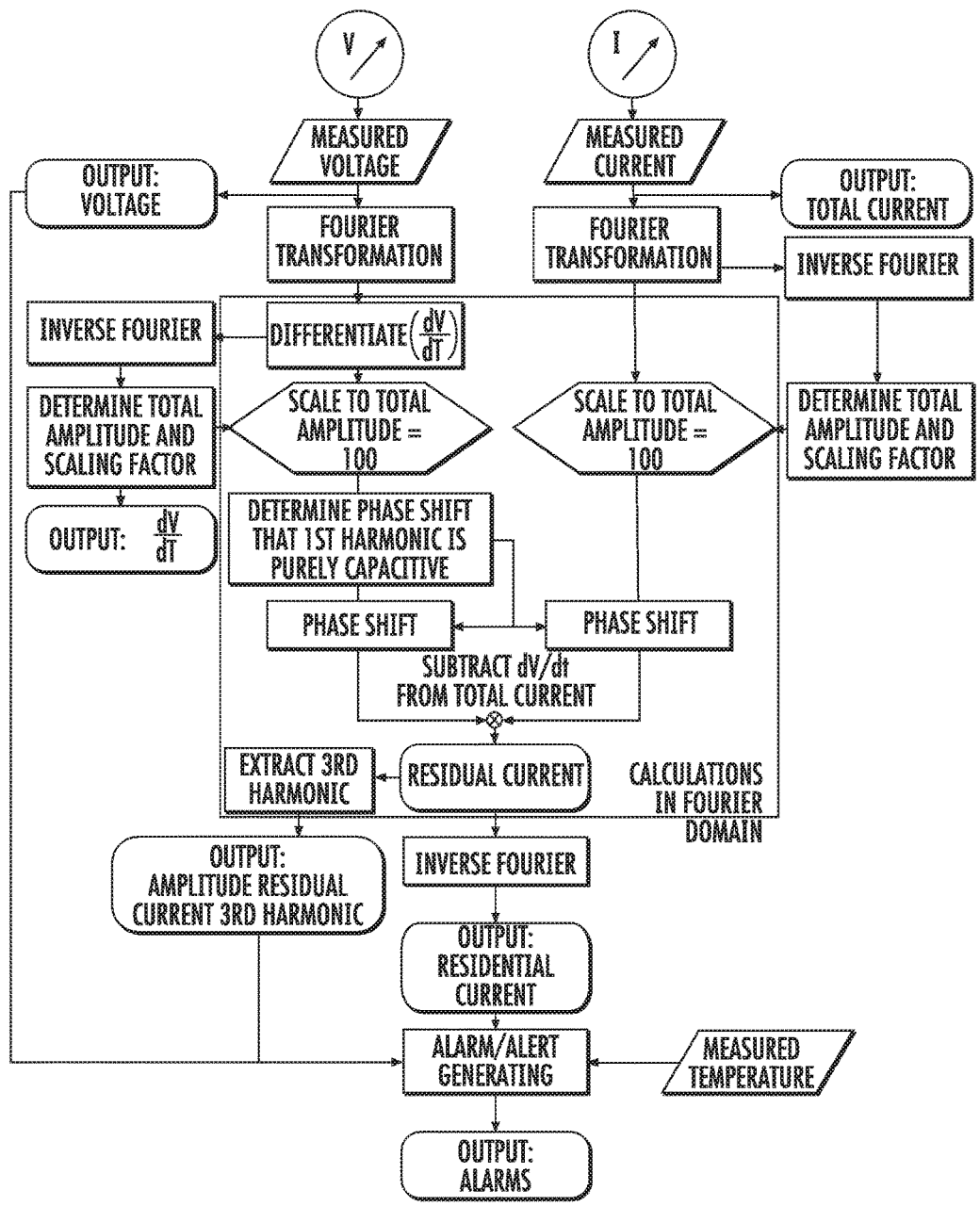
FIG. 4 is a flow diagram showing Fourier analysis used to monitor health and generate an alarm.
Figure 7:
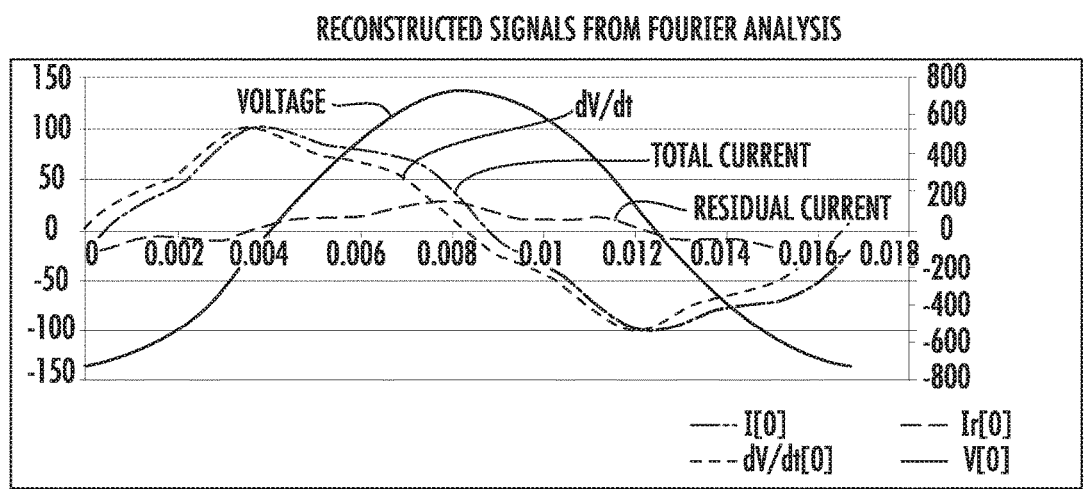
FIG. 7 shows reconstructed signals developed using the analysis of FIG. 4.

As shown in FIGS. 4 and 7, the electronics board 20 uses algorithms imbedded in the microprocessors of the electronics board 20 to process the measured voltage and current waveforms to reconstruct the signals and set thresholds for alarms. The algorithms are used to analyze the measured data to determine metrics representative of (1) total leakage current, (2) residual and resistive leakage current, (3) $3^{rd}$ harmonic of the residual and resistive current, (4) applied voltage, and (5) temperature. The electronics board 20 then uses the communication system via the antenna 22 to transmit the metrics. If the metrics exceed the pre-determined thresholds, alarms and or alerts are provided to instruct utility personnel to repair, replace, and/or inspect the arrester 14. It should be appreciated that the alarms and/or alerts may be visual, audible, and/or a combination. The electronics board 20 can also transmit "raw" data for current and voltage waveforms.

The foregoing has described a sensor to monitor a health of a surge arrester. All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends any novel one, or any novel combination, of the features disclosed in this specification (including any accompanying claims, abstract and drawings), or to any novel one, or any novel combination, of the steps of any method or process so disclosed.

We claim:

1. A surge arrester sensor configured to monitor a health of a surge arrester, comprising:
    (a) a housing;
    (b) a sensor assembly contained in the housing, the sensor assembly including an electronics board to receive, transmit, process, and store signals; and
    (c) a voltage measurement strap extending around a periphery of the housing, the voltage measurement strap being electrically connected to the electronics board and configured to measure voltage using electric field,
wherein the voltage measurement strap is insulated from a sidewall of the housing by insulating standoffs positioned between the voltage measurement strap and the sidewall.

2. The surge arrester sensor according to claim 1, further including a central shaft extending through a center of the housing between a first arrester side of the housing and a second non-arrester side of the housing, the central shaft being grounded only to the second non-arrester side of the housing to reduce a capacitive current measured from the surge arrester sensor to ground.

3. The surge arrester sensor according to claim 2, further comprising a current transformer positioned around the central shaft, the current transformer being electrically connected to the electronics board to measure leakage current.

4. The surge arrester sensor according to claim 1, wherein the surge arrester sensor is attached to an energized end of the surge arrester.

5. The surge arrester sensor according to claim 1, further including:
(a) a power source electrically connected to the electronics board to provide electrical current to the electronics board; and
(b) an RF antenna electrically connected to the electronics board to transmit and receive the signals.

6. A method of determining a health of a surge arrester using the surge arrester sensor of claim 1, comprising:
(a) attaching the surge arrester sensor to an energized end of the surge arrester;
(b) using the voltage measurement strap to measure electric field on the energized end of the surge arrester and derive an energization voltage waveform therefrom;
(c) using the electronics board to process measured voltage waveforms produced by the voltage measurement strap and determine metrics; and
(d) using an antenna electrically connected to the electronics board to transmit the metrics to a remote location.

7. The method according to claim 6, further comprising:
(a) using a current transformer to measure leakage current;
(b) using a Rogowski coil to measure surge currents diverted by the surge arrester; and
(c) using the electronics board to process measured currents waveforms produced by the current transformer and Rogowski coil and determine metrics.

8. The method according to claim 7, wherein the metrics are representative of total leakage current, residual and resistive leakage current, third harmonic of the residual and resistive leakage current, applied voltage, and temperature.

9. The method according to claim 6, further including the step of using the electronics board to set thresholds for alarms based on the processed measured voltage waveforms.

10. The method according to claim 9, wherein when the metrics exceed the thresholds, alarms and/or alerts are provided to instruct personnel to perform an action selected from the group consisting of repair, replace, and inspect the arrester.

11. A surge arrester sensor, comprising:
(a) a housing having a sensor assembly contained therein, the housing including first and second spaced-apart ends interconnected by a sidewall;
(b) a voltage measurement strap extending around a periphery of the housing and electrically connected to the sensor assembly; and
(c) a central shaft extending through a center of the housing, the central shaft having a first distal end attached to an energized end of a surge arrester and a second distal end connected to an energized conductor,
wherein the voltage measurement strap is insulated from the housing by insulating standoffs positioned between the voltage measurement strap and the housing, and
wherein voltage measurement strap is configured to measure voltage using electric field.

12. The surge arrester sensor according to claim 11, wherein the sensor assembly includes:
(a) an electronics board to receive, transmit, process, and store signals;
(b) a Rogowski coil electrically connected to the electronics board to measure surge currents diverted by the surge arrestor; and
(c) a current transformer electrically connected to the electronics board to measure leakage current.

13. The surge arrester sensor according to claim 12, wherein the current transformer is positioned around the central shaft and is constructed of a ferromagnetic core wound with copper wire.

* * * * *